United States Patent [19]

Burnham

[11] Patent Number: 4,857,971
[45] Date of Patent: Aug. 15, 1989

[54] $(IV)_x(III-V)_{1-x}$ ALLOYS FORMED IN SITU IN III-V HETEROSTRUCTURES

[75] Inventor: Robert D. Burnham, Wheaton, Ill.
[73] Assignee: Xerox Corporation, Stamford, Conn.
[21] Appl. No.: 219,036
[22] Filed: Jul. 14, 1988

Related U.S. Application Data

[62] Division of Ser. No. 29,297, Mar. 23, 1987.

[51] Int. Cl.$^4$ .............................................. H01L 29/88
[52] U.S. Cl. .......................................... 357/4; 357/61; 357/17
[58] Field of Search ...................... 357/61, 4, 4 SL, 17

[56] References Cited

U.S. PATENT DOCUMENTS

| | | | |
|---|---|---|---|
| 4,561,005 | 12/1985 | Shannon | 357/4 |
| 4,695,857 | 9/1987 | Baba | 357/4 |
| 4,760,430 | 7/1988 | Coon | 357/4 |

Primary Examiner—Martin H. Edlow

[57] ABSTRACT

A high performance III-V heterostructures exhibiting quantum size effects has been achieved in MODCVD utilizing in situ grown $(IV)_x(III-V)_{1-x}$ alloys, where (IV) is a group IV element comprising Si, Ge, C or Sn or admixtures thereof and (III-V) is a group III-V binary, trinary, quaternary or pentad compound or alloy such as, for example, GaAs, AlAs, GaAlAs, GaAlAsP, InGaAlP, InAlAsP or InGaAlAsP. Specific examples are $(Si_2)_x(GaAs)_{1-x}$, which is an alloy that functions as a barrier when grown in situ in a GaAs active region of a heterostructure and $(Ge_2)_x(GaAs)_{1-x}$, which is an alloy that functions as a quantum well when grown in situ in GaAs or GaAlAs active region (e.g. highest refractive index and narrowest bandgap) of a heterostructure. The disclosure further relates to the utilization of a nucleating or catalytic process wherein a small amount of a cluster collector or anchorage component, e.g., Al, Mg or Ti, on the surface of the sample in the reaction zone of the MOCVD reactor. This component is believed to function as a nucleating or catalytic site to which IV—IV pairs initially attach and, thereafter, continually attach to form islands that provide three dimensional barriers or wells in an active region of a heterostructure. Another aspect of the disclosure deals with in situ induced disordering vis a vis surface initiated impurity induced disordering (SIIID) as known in the art. Superlattice or well disordering can be achieved in situ during crystal growth rather than by introduction of an impurity component into the superlattice as contemplated in SIIID.

16 Claims, 9 Drawing Sheets

$(IV)_x(III-V)_{1-x}$ ALLOYS FORMED IN SITU IN III-V HETEROSTRUCTURES

This is a division of application Ser. No. 07/029,297, filed Mar. 23, 1987.

BACKGROUND OF THE INVENTION

This invention relates to composition of matter in the form of $(IV)_x(III-V)_{1-x}$ incorporated into heterostructures during their growth in metalorganic chemical vapor deposition (MOCVD) and methods for incorporation and more particularly in their utilization in quantum well structures as wells and barriers for semiconductor devices, e.g. semiconductor heterostructure lasers and heterostructure transistor devices.

Since the successful fabrication of III-V alloys and their utilization in p-n junction devices commencing actively in the early 1960's, there has been interest to develop more complicated alloys, such as alloys in the form of $(IV)_x(III-V)_{1-x}$. An example of this work are found in U.S. Pat. No. 3,979,271 relating to a sputtering deposition system forming many different kinds of alloys including, e.g., $(GaAs)_{1-x}Si_x$ and $(GaAs)_{1-x}Ge_x$. Also, U.S. Pat. No. 4,169,727 relates to the bulk alloying at high temperatures Si and GaAs to form a single phase crystalline alloy of silicon and gallium arsenide. The article of K. Kim et al., "Model for the Metastable System of Type $(GaAs)_{1-x}(Ge_2)_x$", *Physical Review Letters*, Volume 32, pp 1019-1026 (July 15, 1985) and the first five references cited therein relate to the studies both experimental and theoretical relating to the formation of the alloy, $(Ge_2)_x(GaAs)_{1-x}$. In particular, in the article of ZhI. Alferov et al, "Preparation and Investigation of Metastable Continuous Solid Solutions in Ge-GaAs System", *Soviet Phys. Semicond.*, Vol. 16, pp. 532-537, May, 1982, has considered $(Ge_2)_x(GaAs)_{1-x}$, prepared in the more advanced techniques of MOCVD vis a vis sputtering deposition. However, no one has been able to achieve successful growth of $(IV)_x(III-V)_{1-x}$ alloys in situ to form a p-n heterojunction semiconductor device.

SUMMARY OF THE INVENTION

According to this invention, high performance III-V heterostructures exhibiting quantum size effects has been achieved in MOCVD utilizing in situ grown $(IV)_x(III-V)_{1-x}$ alloys, where (IV) is a group IV element comprising Si, Ge, C or Sn or admixtures thereof and (III-V) is a group III-V binary, trinary, quaternary or pentary compound or alloy such as, for example, GaAs, AlAs, GaAlAs, GaAlAsP, InGaAlP, InAlAsP or InGaAlAsP.

Specific examples are $(Si_2)_x(GaAs)_{1-x}$, which is an alloy that can function as a barrier when grown in situ in a GaAs active region of a heterostructure the Si concentration in GaAs being in the direct bandgap region for the direct/indirect transition for GaAs and Si, i.e. x is approximately equal to or less than about 0.50 and $(Ge_2)_x(GaAs)_{1-x}$, which is an alloy that functions as a quantum well when grown in situ in a GaAs or GaAlAs active region (e.g. highest refractive index and narrowest bandgap) of a heterostructure the Ge concentration in GaAs being in the direct bandgap region for the direct/indirect transition for GaAs and Ge. While it is recognized that large doping or alloying amounts of, for example, Si or Ge at $10^{17}$–$10^{18}/cm^3$, may be introduced via diffusion into GaAs in molecular IV—IV paired form (Si—Si; Ge—Ge and Si-Ge), given higher diffusion temperatures, for example, in the case of Si around 825° C., it has not been recognized to successfully form heterostructures having in situ, epitaxially grown $(IV)_x(III-V)_{1-x}$ alloys wherein the IV element concentration reaches the solubility limit in the III-V material at its melting point, e.g. Si concentration of $2 \times 10^{20}/cm^3$ or above in GaAs. The result to be achieved is for the in situ formation of high concentrations of IV—IV pairs above conventional "doping" concentrations to form an $(IV)_x(III-V)_{1-x}$ alloy.

The temperature range at which such an alloy formation is accomplished in situ is dependent on the particular alloying material chosen and also on the surface kinetics of the specimen or sample undergoing epitaxial deposition in the MOCVD reactor. Surface kinetics involves surface mobility of alloying atoms or atomic pairs, such as Si—Si pairs.

A further aspect of this invention relates to the utilization of a nucleating or catalytic process wherein a small amount of a cluster collector or anchorage component, e.g., Al, Mg or Ti, on the surface of the sample in the reaction zone of the MOCVD reactor. This component is believed to function as a nucleating or catalytic site to which IV—IV pairs initially attach and, thereafter, continually attach to form islands that provide three dimensional barriers wells in an active region of a heterostructure.

A further aspect of this invention deals with in situ induced disordering vis a vis surface initiated impurity induced disordering (SIIID) as known in the art. Superlattice or well disordering can be achieved in situ during crystal growth rather than by introduction of an impurity component into the superlattice as contemplated in SIIID in the matter taught and claimed in U.S. Pat. No.4,511,408.

Other objects and attainments together with a fuller understanding of the invention will become apparent and appriciated by referring to the following description and claims taken in conjunction with the accompanying drawings.

DETAILED DESCRIPTION OF THE PREFERRED EMBODIMENTS

Figure 1:
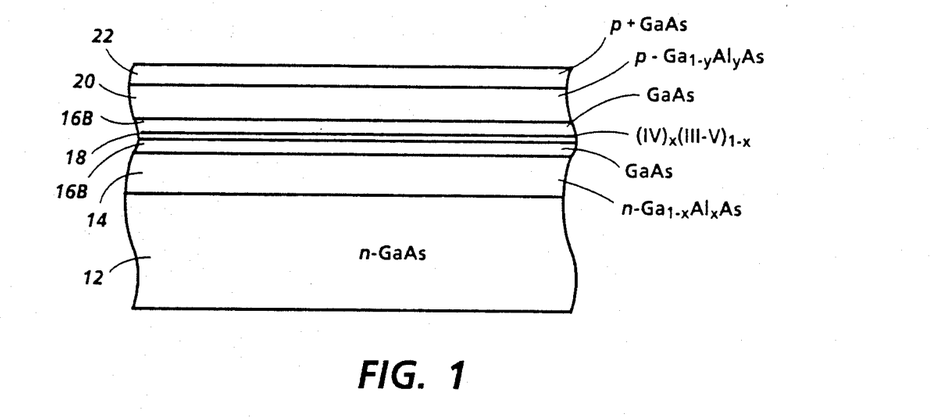
FIG. 1 is a schematic side view of a heterostructure having a plurality of contiguous semiconductor layers including an in situ grown $(IV)_x(III-V)_{1-x}$ alloy in one of its layers.

Reference is now made to FIG. 1 wherein there is shown a GaAs/$Ga_{1-x}Al_xAs$ quantum well heterostructure 10 having a $(IV)_x(III-V)_{1-x}$ alloy formed in the quantum well region of the structure. Heterostructure 10 comprises a n-GaAs substrate 12 upon which are epitaxially grown, via MOCVD, a n-$Ga_{1-x}Al_xAs$ cladding or confinement layer 14, an undoped GaAs region 16 during the growth of which a $(IV)_x(III-V)_{1-x}$ alloy 18 is formed in active region 16, a p-$Ga_{1-x}Al_xAs$ cladding or confinement layer 20, and a contact layer 22 of p+GaAs. Confining layers 14 and 20 may be double cladding layers having respectively different Al content forming an optical waveguide cavity as is known in the art. The specific design of heterostructure 10 is useful as heterostructure laser device, although the utility of employing a $(IV)_x(III-V)_{1-x}$ alloy in such a structure may be extended to other semiconductor devices, for example, III-V transistor heterostructures. The $(IV)_x(III-V)_{1-x}$ alloy may be a group IV element such as C, Si, Ge or Sn. The III-V material may be a binary, ternary, quaternary or pentary compound or alloy, such as GaAs, GaAlAs, AlAs, GaAlAsp, InGaAlP, InAlAsP, or InGaAlAsP. Specific examples relative to the present invention are the alloys $(Ge_2)_x(GaAs)_{1-x}$ and $(Si_2)_x(GaAs)_{1-x}$ incorporated into active region 16 of heterostructure 10 as depicted respectively in FIGS. 2A and 2B.

In considering $(Si_2)_x(GaAs)_{1-x}$, it is recognized that large doping amounts of Si or Ge, e.g. in the range of $10^{17}$–$10^{18}$/cm$^3$, may be introduced, e.g. via diffusion, into GaAs region 16 if Si is available as a surface initiated diffusion element under proper diffusion conditions and temperatures. However, it has never been recognized if it is possible to deposit Si—Si pairs or clusters in excess of doping concentrations, i.e. at $10^{20}$cm$^3$ or above to form in situ the alloy, $(Si_2)_x(GaAs)_{1-x}$. By exceeding the Si—Si pair concentration of doping, the formation of this alloy can be achieved in MOCVD processing, both for single quantum well heterostructures and multiple quantum well hetrostructures.

Heterostructure 10 is grown by employing conventional MOCVD processing which is well known in the art and the basic of this process are set forth in U.S. Pat. No. 4,368,098, in the article of Russell D. Dupuis et al., "Preparation and Properties of $Ga_{1-x}Al_xAs$-GaAs Heterostructure Lasers Grown by Meltalorganic Chemical Vapor Deposition", *IEEE Journal Of Quantum Electronics*, Vol. QE-15(3), pp. 128-135, March, 1979 and the article of Russell D. Dupuis, "$Ga_{1-x}Al_x$-As-286 Heterostructure Lasers Grown by Metalorganic Chemical Vapor Deposition", *Japanese Journal of Applied Physics*, Vol. 19, pp. 415–423 (1980). However, it is important to emphasize that in the pyrolytic process of the present invention, the temperature range of operation at the reaction zone for the growth of a $(IV)_x(III-V)_{1-x}$ alloy is important, if not critical, with temperature dependent on the particular IV element being utilized.

Figure 2A:
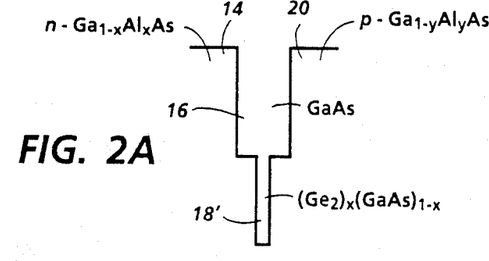
FIG. 2A is an energy band profile for an in situ grown alloy, $(Ge_2)_x(GaAs)_{1-x}$, where the concentration of x provides a direct bandgap material, and is incorporated into the active region of the heterostructure shown in FIG. 1.
Figure 2B:
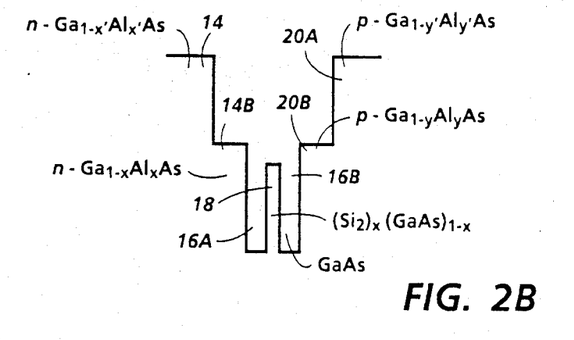
FIG. 2B is an energy band profile for an in situ grown alloy, $(Si_2)_x(GaAs)_{1-x}$, where the concentration of x provides a direct bandgap material, and is incorporated into the active region of heterostructure shown in FIG. 1.

By way of specific example, heterostructure 10, as represented, in part, in FIG. 2B in the form of an energy band profile, may be a double optical confinement cavity for heterostructure laser comprising an outer confinement layer 14A of n-$Ga_{1-x'}Al_{x'}As$ wherein x'=0.85 and is about 1 μm thick and an inner optical confinement layer 14B of n-$Ga_{1-x}Al_xAs$ wherein x=0.35 or 0.40 and is about 0.1 μm thick. After growth of these double confinement layers, epitaxial growth continues with growth of the lower half 16A of the GaAs quantum well region 16, a sheet layer 18 of Si followed by the growth of the top half 16B of the GaAs quantum well region 16. The overall thickness of region 16 may be, for example, 50 Å-150 Å thick with GaAs layers 16A and 16B each about 30Å thick and the resulting in situ formed alloy $(Si_2)_x(GaAs)_{1-x}$ about 20 Å thick. This is followed by the growth of the inner confinement layer 20B of p-$Ga_{1-y}Al_yAs$ wherein y=0.35 or 0.40 and is about 0.1 μm thick and an outer confinement layer 20A of n-$Ga_{1-y'}Al_{y'}As$ wherein y'=0.85 and is about 1 μm thick, followed by the conventional cap layer 22 which is about 0.1 μm thick.

During the MOCVD growth process, the Si is supplied in the form of $SiH_4$ in combination with arsine or $AsH_3$ into the MOCVD reactor to the reaction zone of the sample for a short period of time, such as opening the valves for these gas flows for a period of 1–10 seconds. The reaction zone must be maintained within a fairly critical temperature range, which in the case of Si is in the range of about 800° C.-850° C., preferably in the region of 800° C.-825° C., at atmospheric pressure. This temperature range is for Group V:Group III molar ratio for AsH$_3$ to (CH$_3$)$_3$Ga, and AlH$_3$, if present, equal to about 80:1. Otherwise, the (Si$_2$)$_x$(GaAs)$_{1-x}$ alloy will not properly form. Growth experiments were tried below 800° C., e.g. at 750° C. and the (Si$_2$)$_x$(GaAS)$_{1-x}$ alloy formation did not occur. The introduction of SiH$_4$ with arsine is believed to encourage the deposited formation of Si—Si pairs if the temperature is maintained in the above mentioned range. In particular, the growth of GaAs layer 16 at the quantum well is stopped and the reactor is purged with H$_2$ and arsine. Then, SiH$_4$ with arsine is provided for a short period of time into the reactor, e.g. for about 1 second. The reactor is then, again, purged with H$_2$ and arsine and the GaAs growth of layer 16 is continued. The resultant quantum well structure includes a 20 Å band of the (Si$_2$)$_x$-(GaAs)$_{1-x}$ alloy in the middle of a 240 Å GaAs quantum well.

A TEM micrograph of the active region 16 of heterostructure 10 revealed a (Si$_2$)$_x$(GaAs)$_{1-x}$ barrier or indirect bandgap material 18 in the center of active region 16 free of dislocations and about 23 Å thick Layer 18 shows up in the TEM micrograph as a white line and is characterized as (Si$_2$)$_x$(GaAs)$_{1-x}$, particularly since a compound of Si and As is highly unlikely if not even possible. Photoluminescence and laser data also reveals that the Si is not simply incorporated as an ordinary dopant and, in fact, if Si were incorporated at doping densities about 10$^{20}$/cm$^3$, TEM imaging would not reveal a white line in the TEM micrograph.

Specifically, it is important to note that during the MOCVD growth of the alloy 18 in GaAs quantum well region 16, only SiH$_4$ and AsH$_3$ were introduced into the MOCVD reactor at a temperature of about 825° C. to form the sheet like layer or film 18 of Si$_2$ on the surface of GaAs layer 16A which pyrolytically in situ forms into the alloy (Si$_2$)(GaAs)$_{1-x}$.

Figure 4:
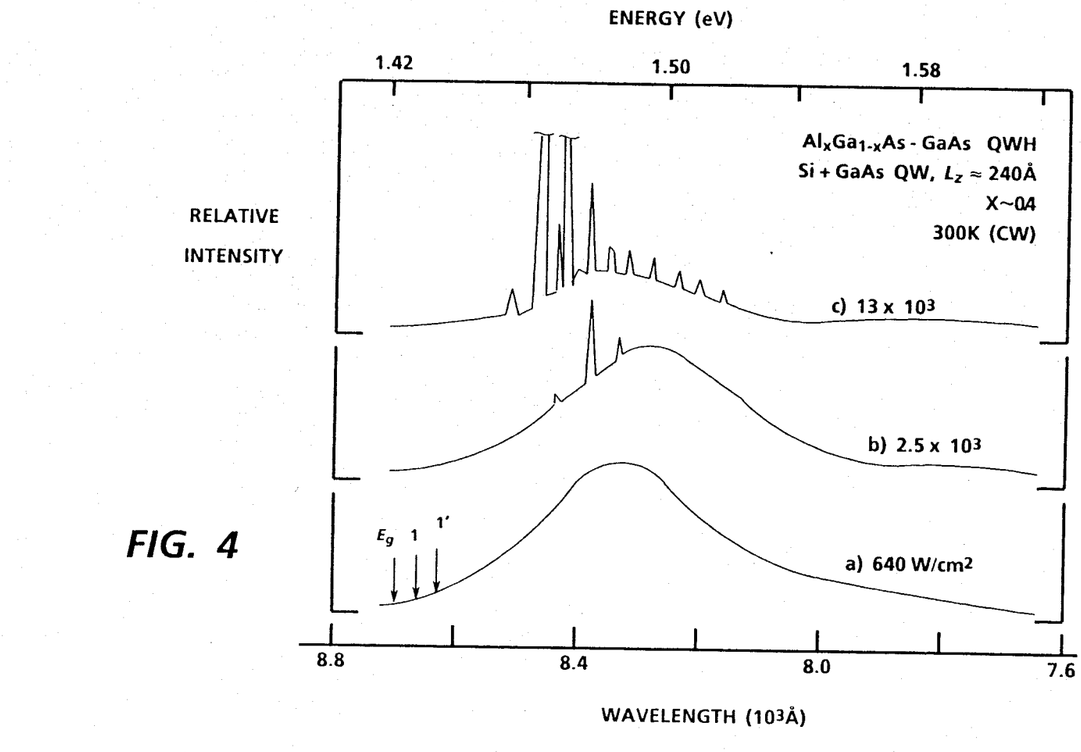
FIG. 4 is a photoluminescence spectra at room temperature for a quantum well heterostructure of the type illustrated in FIG. 2B.

FIG. 4 is the photoluminescence spectra at room temperature under continuous wave operation for heterostructure 10 of FIG. 1. To perform this spectra examination, substrate 10 and cap layer 22 were removed and cleaved samples from the as grown crystal were heat sunk in Cu under diamond windows or in In under sapphire windows and the samples were pumped with an Ar$^+$5145 Å laser. Laser threshold occurred at 2–2.5×10$^3$ W/cm$^2$ or an equivalent current density of 0.8–1.0 KA/cm$^2$, as shown at curve (b). Below threshold operation is shown in curve (a) of FIG. 4 and higher above threshold operation at 13×10$^3$/cm$^2$ is shown at curve (c) of FIG. 4. The lowest electron-to-heavy-hole (n=1e→hh) and electron-to-light-hole (n=1'e→lh) transitions expected for a sturcture of this nature, i.e. a GaAs quantum well region 16 about 240 Å thick located between Ga$_{1-x}$Al$_x$As waveguide confining layers of x=0.40, are marked at 1 and 1' on curve (a) of FIG. 4. If a higher bandgap (Si$_2$)$_x$(GaAs)$_{1-x}$ barrier 18 exists in the center of active region 16, then the states and transitions are modified and shifted to higher energy which is consistent with the photoluminescence data and laser operation in FIG. 4, i.e. with a ΔE shift of about 50–60 meV in laser operation 1 and 1', which is caused by the presence of the higher bandgap barrier 18 in the center of active region 16.

Similar results were obtained for smaller quantum well regions 16, e.g. wherein region 16 consisted of layers 16A and 16B or 30 Å and a (Si$_2$)$_x$(GaAs)$_{1-x}$ barrier 18 in the center of region 16 about 20 Å thick.

FIG. 2A shows an energy based profile for a heterostructure having a(Ge$_2$)$_x$(GaAs)$_{1-x}$ alloy 18' deposited in the center of a quantum well region 16 of GaAs. Pyrolytic deposition of alloy 18' is accomplished in the MOCVD reactor by introducing the flow of GeH$_4$ and AsH$_3$ to the reaction zone for a period of time, for example 1–10 seconds. The alloy, (Ge$_2$)$_x$(GaAs)$_{1-x}$, however forms a quantum well 18' having a small bandgap property compared to active region 16. Thus, this alloy formed in a laser heterostructure will function as the central active layer 18' relative an active region comprising layers 16 and 18'. This type of heterostructure in heterostructure laser configuration provides for longer wavelength operation. A similar heterostructure with very low threshold as well as longer wavelength operation, such as in the 1.06 μm emission range, is comprised of an active region, for example, of 60 Å thick (Ge$_2$)$_x$-(GaAs)$_{1-x}$ alloy formed between a pair of inner confining GaAlAs layers, e.g. Ga$_{0.65}$Al$_{0.35}$As, to provide a waveguide region of 1300 Å in breath. Ge$_2$ has the same lattice match as AlAs and GaAs and the Ge alloy would also have utility in lattice matching between the binary GaAs and the quatenary GaInAsP.

In summary, if the temperature conditions are proper, Ge will deposit as Ge—Ge pairs which provides for the opportunity of fabricating semiconductor heterostructure lasers having lower energy luminescence, e.g. at longer wavelengths of 0.87–1.7 μm.

Also, as known in the art, Si, as an outside impurity source, may be utilized in surface initiated impurity induced disordering as taugth in U.S. Pat. No. 4,511,408 by diffusion or implantation and anneal into a quantum well or superlattice structure which will tend to disorder the structure and render it substantially homogenous with adjacent related layers. However, in the situation here, in situ incorporation of IV—IV pairs as a submonolayer, and possibly a monolayer or more, in a well or superlattice structure as the structure is actually being epitaxially deposited, to form an in situ (IV)$_x$(III-V)$_{1-x}$ alloy has not been previously suggested or contemplated. By incorporating Si—Si pairs in a well or superlattice structure or spatially as periodic traces or spikes throughout a well structure, to be specifically discussed later, a shift to lower well energy is observed to take place with lower wavelength operation possible. Thus, submonolayers or monolayers of (Si$_2$)$_x$-(GaAs)$_{1-x}$ can be included in the growth of a quantum well or other such active region without causing impurity induced disordering to occur.

From work done with surface initiated impurity induced disordering (SIIID), Si as a disordering component tends to diffuse into GaAs as Si—Si pairs. However, by placing a Si submonolayer in a quantum well structure, Si is "diffused" from within the well or wells rather than surface initiated so that any quantum well disordering is minimized. Otherwise, if Si is surface initiated from outside the well, the well would become disordered from enhanced Ga and Al interdiffusion as is known in the SIIID art.

Figure 3A:
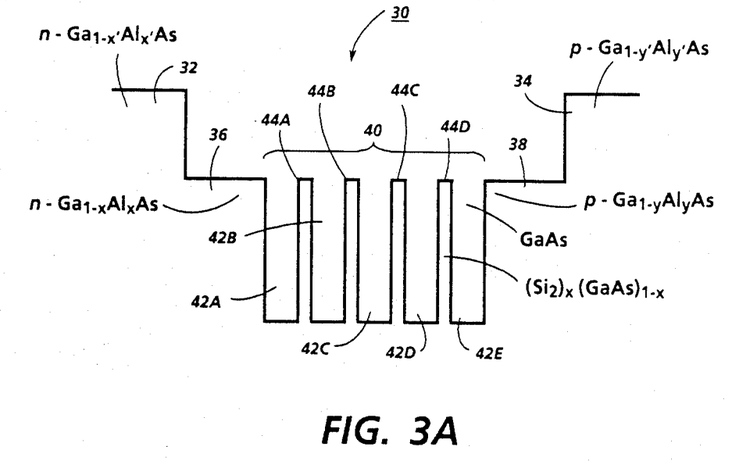
FIG. 3A is an energy band profile for a multiple quantum well heterostructure having a plurality of in situ, spatially grown alloy layers comprising $(Si_2)_x(GaAs)_{1-x}$ in the active region of a heterostructure.

The function of an alloy, (IV)$_x$(III-V)$_{1-x}$, sheet layer as a barrier or well also has utility in a multiple quantum well design. Illustrations are shown in FIG. 3. FIG. 3A illustrates the energy based profile of a multiquantum well heterostructure 30 comprising outer cladding or confinement layers 32 and 34, inner cladding layers 36 and 38 and active region 40. Active region 40 consists of wells 42A–42E of GaAs and barriers 44A–44D of (Si$_2$)$_x$-(GaAs)$_{1-x}$. In epitaxially depositing region 40, alternate timed gas flows of SiH$_4$ plus AsH$_3$ and (CH$_3$)$_3$Ga plus AsH$_3$ are supplied to the reaction zone of the MOCVD reactor pyrolytically forming alternate layers of GaAs and $(Si_2)_x(GaAs)_{1-x}$. As an example of a particular multiple quantum well heterostructure 30 for incorporation as a double hetrostructure laser, active region 40 may be 380 Å thick, quantum wells 42A, 42B, 42C, 42D and 42E may be each about 60 Å thick and barriers 44A-44D may be each about 20 Å thick.

Figure 3B:
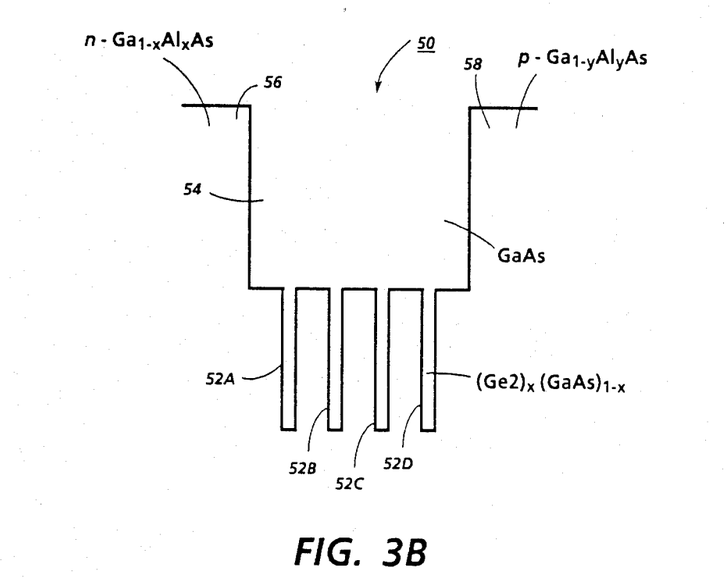
FIG. 3B is an energy band profile for a heterostructure having a plurality of in situ, spatially grown alloy layers comprising $(Ge_2)_x(GaAs)_{1-x}$ in the region of a heterostructure.

FIG. 3B shows an energy band profile applicable for multiple quantum well structure alloy utilizing the $(Ge_2)_x(GaAs)_{1-x}$ comprising four wells 52A-52D in conjunction with GaAs active region 54 confined by cladding layers 56 and 58. In epitaxially depositing region 40, alternate timed gas flows of $GeH_4$ plus $AsH_3$ and $(CH_3)_3Ga$ plus $AsH_3$ are supplied to the reaction zone of the MOCVD reactor pyrolytically forming alternate layers of GaAs and $(Ge_2)_x(GaAs)_{1-x}$. The reaction zone for Ge must be at temperature within the range of about 500° C.-700° C. at atmospheric pressure. Otherwise, the $(Ge_2)_x(GaAs)_{1-x}$ alloy will not properly form. This temperature range is for Group V:GroupIII molar ratio for $AsH_3$ to $(CH_3)_3Ga$, and $AlH_3$, if present, equal to about 80:1. At lower pressures, i.e. 0.1-0.01 atmospheric pressure, the reaction zone temperature for Ge should be in the range of about 400° C.-450° C.

Figure 5:
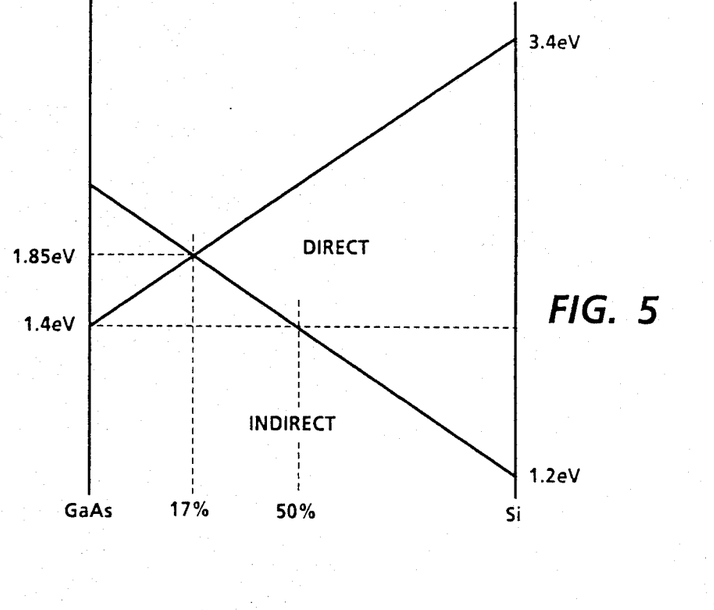
FIG. 5 is a graphic illustration of the direct/indirect transition for GaAs and Si.

FIG. 5 illustrates the direct/indirect transition for the alloy $(Si_2)(GaAs)_{1-x}$ wherein the cross transition point is about 17% Si with an Eg of approximately 1.85 eV, whereas the Eg for GaAs is 1.4 eV.

Figure 6:
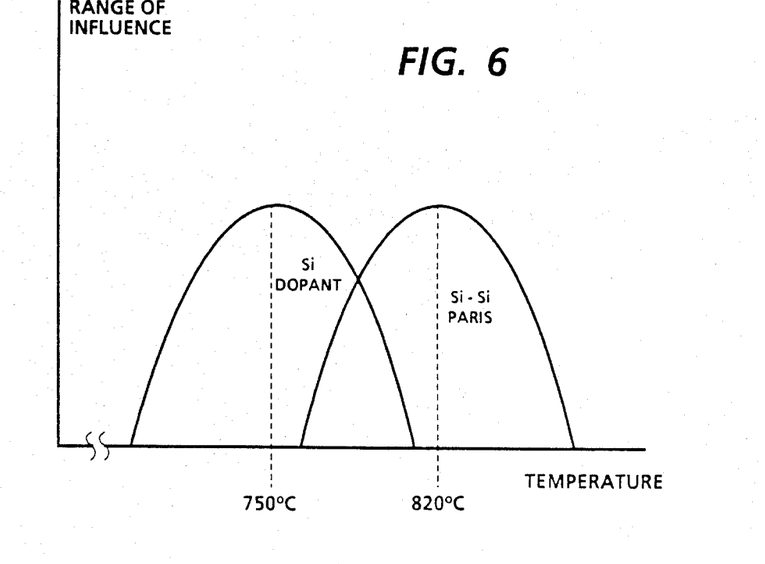
FIG. 6 is a schematic graphic illustration of the influence of temperature relative to dopant level incorporation of Si vis a vis Si—Si pair formation and soluble level incorporation of $Si_2$.

FIG. 6 illustrates what is termed the range of influence of dopant Si and soluble Si in GaAs relative to the pyrolytic temperature at the reaction zone in the MOCVD reactor. The purpose of this illustration is to indicate how critical the temperature is in order to induce the deposition of Si—Si pairs vis-a-vis Si atoms per se. If the temperature of reaction is within the band of curve 60, the depostion involving doping amounts of Si into GaAs. However, if the temperature of reaction is within the band of curve 62, large soluble concentrations can be achieved and Si is best available in this form at a temperature of about 820° C.-825° C. for Si. Deposition within this temperature range of influence, Si—Si pair solubility can exceed doping concentrations and enter the realm of alloying concentrations of $10^{20}/cm^3$ or greater.

Figure 7:
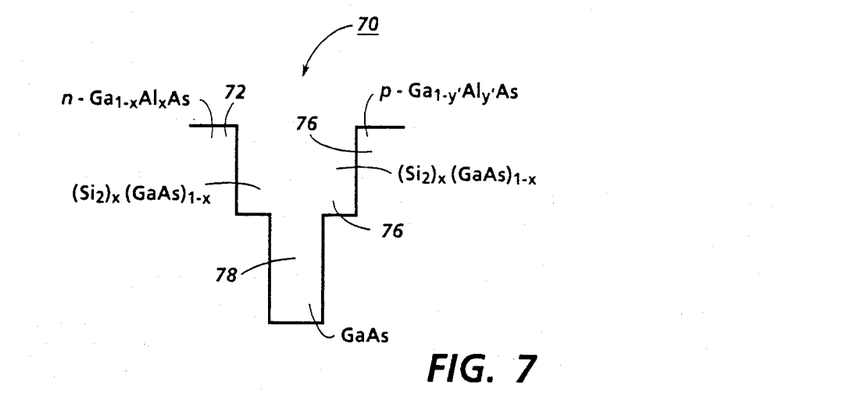
FIG. 7 is an energy band profile for a single quantum well heterosturcture with in situ grown alloy layers of $(Si_2)_x(GaAs)_{1-x}$ incorporated in spatially separated confinement layers of the heterostructure.

FIG. 7 illustrates an energy band profile for heterostructure 70 having good carrier collection and optical confinement properties with emmission in the visible range wherein the confinement layers are a $(IV)_x(GaAs)_{1-x}$ alloy consisting of indirect bandgap material having higher bandgap than the active region of the heterostructure. Heterostructure 70 comprises outer cladding layers 72 and 74 of n-$Ga_{1-x}Al_xAs$ and p-$Ga_{1-y}Al_yAs$, inner cladding layers 76 of the alloy $(Si_2)_x(GaAs)_{1-x}$ where, for example, the Si concentration is sufficiently large to provide an indirect bandgap material, such as 20% or $(Si_2)_{0.20}(GaAs)_{0.80}$, and a quantum well 78 of GaAs.

It is believed that the alloy, $(Si_2)_x(GaAs)_{1-x}$, also has the unique property of preventing the diffusion of certain impurities through a region comprising the alloy. For example, it appears that Zn cannot readily diffuse through the $(Si_2)_x(GaAs)_{1-x}$ alloy layer. Thus, for example, this alloy layer may function as an internal termination point for Zn diffusion propagating through an existing superlattice positioned above an in situ grown $(Si_2)_x(GaAs)_{1-x}$ alloy layer in the same heterostructure.

Figure 8:
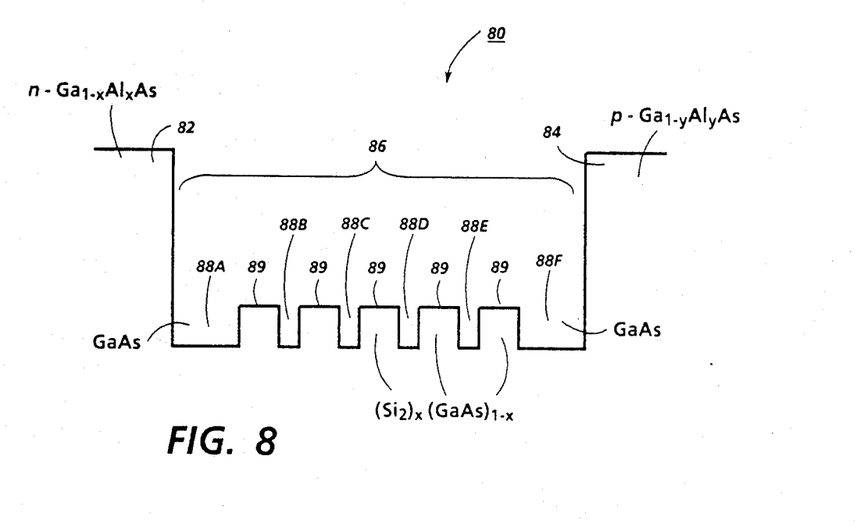
FIG. 8 is an energy band profile for a multiple quantum well heterostructure having a plurality of in situ, spatially grown alloy barrier layers comprising $(Si_2)_x(GaAs)_{1-x}$ in the active region of the heterostructure.

FIG. 8 is an energy band profile for a multiple quantum well hetrostructure 80 comprising outer confinement layers 82 and 84 of n-$Ga_{1-x}Al_xAs$ and p-$Ga_{1-y}Al_yAs$ where, for example, x=0.40, an active region 86 comprising outer quantum wells 88A and 88F of GaAs each 60 Å thick, inner quantum wells 88B-88E of GaAs each 10 Å-10 Å thick, with these wells 88 separated by alloy barriers 89 of $(Si_2)_x(GaAs)_{1-x}$. In forming active region 86, the wells 88 are formed during gas flow periods of $(CH_3)_3Ga$ and $AsH_3$ followed by gas flow periods of $SiH_4$, $(CH_3)_3Ga$ and $AsH_3$. One method of approach is to supply these gas constituents together in a desired molar percentage or, alternatively, alternate the flow of $SiH_4$ into the reactor with the combined flow of $(CH_3)_3Ga$ and $AsH_3$ in a desired molar percentage. As an example of the latter approach, a flow of $SiH_4$ for 10 seconds may be switched to a flow $(CH_3)_3Ga$ and $AsH_3$ for 50 seconds and continually repeated to form a barrier 89. A heterostructure laser utilizing the heterostructure design of FIG. 7 having an active region of 250 Å width may be expected to have an emission wavelength of about 7150 Å.

Figure 9:
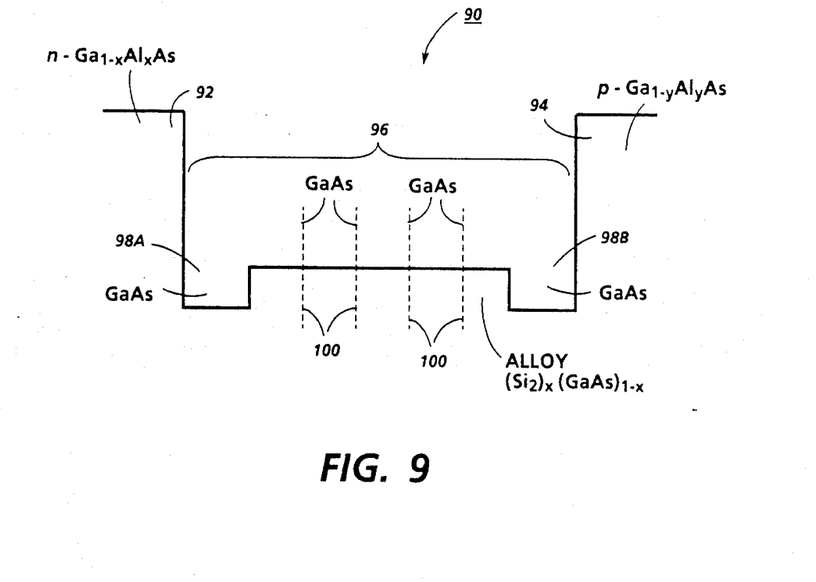
FIG. 9 is an energy band profile for a multiple quantum well heterostructure with a central barrier region comprising the alloy $(Si_2)_x(GaAs)_{1-x}$ with inclusions of multiple GaAs compound spikes or traces in the form of a submonolayer or one or more monolayers thereof.

FIG. 9 is another energy band profile for a multiple quantum heterostructure 90 comprising outer confinement layers 92 and 94 of n-$Ga_{1-x}Al_xAs$ and p-$Ga_{1-y}Al_yAs$ where, for example, x=0.40, an active region 96 of outer quantum wells 98A and 98B which may each be about 60 Å thick with a large central barrier region 99 of $(Si_2)_x(GaAs)_{1-x}$ which may be, for example, about 200 Å thick. In an alloy barrier 99, there are provided spikes or traces comprising submonolayers 100 of GaAs. These submonolayers 100 can be formed by interrupting the flow of $SiH_4$, $(CH_3)_3Ga$ and $AsH_3$ with the combination of $(CH_3)_3Ga$ and $AsH_3$ during the growth of Si/GaAs alloy for a short period of time, such as, for example, 3 seconds, to form a plurality of submonolayers 100 periodically throughout the extent of barrier 100. While the formation of submonolayers 100 is believed to be preferred in this embodiment, it is also within scope of practice of this invention to form one or more monolayers of GaAs spikes 100. Heterostructure 90, when employed in a heterostructure laser, will provide a low threshold device with an emission wavelength of about 8050 Å having high intensity.

Figure 10:
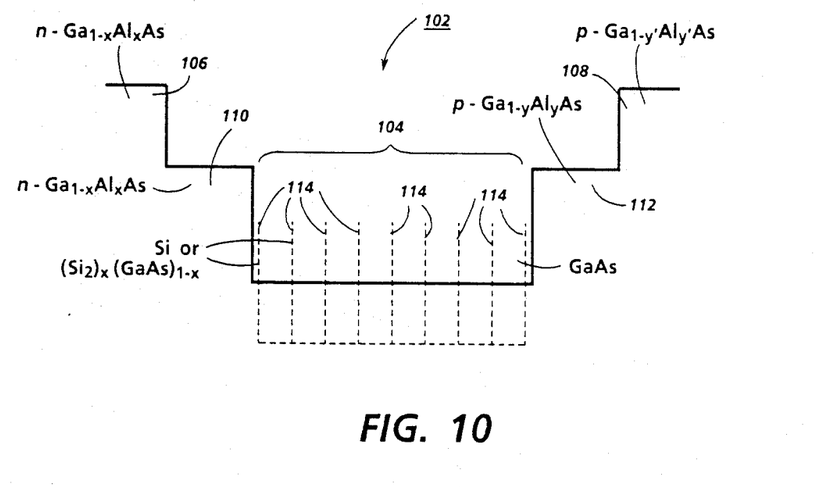
FIG. 10 is an energy band profile for a quantum well heterostructure having a plurality of in situ grown trace amounts or spikes of Si or the alloy, $(Si_2)_x(GaAs)_{1-x}$, in the form of a submonolayer or one or more monolayers thereof.

FIG. 10 is an energy band profile for a heterostructure 102 having a large active region 104. Heterostructure 102 comprises outer confinement layers 106 and 108 of n-$Ga_{1-x'}Al_{x'}As$ and p-$Ga_{1-y'}Al_{y'}As$, where x' and y' may be both equal to 0.85 and inner cladding layers 110 and 112 of n-$Ga_{1-x}Al_xAs$ and $Ga_{1-y}Al_yAs$, where x and y may be both equal to 0.35. Active region may be 240 Å thick comprising GaAs with spikes or traces comprising submonolayers 114 of either Si or the alloy $(Si_2)_x(GaAs)_{1-x}$, for example $(Si_2)_{0.5}(GaAs)_{0.5}$. These submonolayers 114 can be formed by interrupting the flow of $(CH_3)_3Ga$ and $AsH_3$ flow with the combination of $SiH_4$ and $AsH_3$ for a short period of time, such as, for example, 3 seconds, to form a plurality of submonolayers 114 periodically throughout the extent of active region 104. If the temperature during pyrolysis at the reaction zone of the MOCVD reactor is in the range of 750° C., heavy doping concentrations of Si can be periodically introduced. On the other hand, if the temperature is in the range of 820° C.-825° C., for example, Si—Si pairs of clusters are formed, reacting with $(CH_3)_3Ga$ in the presence of $AsH_3$ to form the $(Si_2)_x(GaAs)_{1-x}$ alloy. While the formation of submonolayers is beleived to be preferred in this embodiment, it is also within the scope of practice of this invention to form one or more monolayers of $(Si_2)_x(GaAs)_{1-x}$ spikes 114.

Heterostructure 102 when employed in a heterostructure laser will provide for a partial luminescence device with an emission wavelength of about 6600 Å.

It is within the contemplation of this invention that the alternating flow of $SiH_4$ and then $GeH_4$, both in combination with $AsH_3$, will provide alternating Ge or $(Ge_2)_x(GaAs)_{1-x}$ and Si or $(Si_2)_x(GaAs)_{1-x}$ spikes 114 in the fabrication of heterostructure 102. Other mentioned IV elements may be included in this embodiment in the ways proscribed above.

Figure 11:
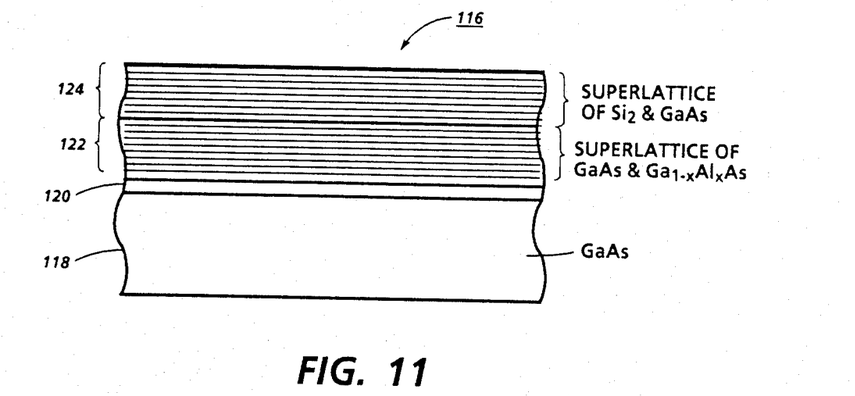
FIG. 11 is a schematic side view of a heterostructure comprising deposited alternating layers of separate alloying consitituents which form an alloy of this invention during pyrolysis in the reaction zone of a MOCVD reactor.

Heterostructure 116 in FIG. 11 relates to a phenomenon referred to as in situ induced disordering which differs from surface initiated impurity induced disordering (SIIID) in not requiring the introduction of the disordering element after crystal growth. Heterostructure 116 was fabricated comprising a GaAs substrate 118 upon which is epitaxially deposited a buffer layer 120 followed by superlattice 122 comprising alternating layers of GaAs and $Ga_{1-x}Al_xAs$, such as $Ga_{0.40}Al_{0.60}As$, each about 300 Å thick. Superlattice 122 was about 2 μm thick. A second superlattice 124 was thereafter deposited on superlattice 122 comprising alternating layers of GaAs, each about 15 Å–20 Å thick, with Si spikes, each comprising a submonolayer thereof. There may be, for example, one hundred such alternating layer in superlattice 124. Such a superlattice can be deposited in a 30 minute period of time. The growth of heterostructure 116 in the MOCVD reactor was accomplished at 775° C. After completion of growth, heterostructure 116 was examined via SEM and it was observed that the GaAs-GaAlAs superlattice 122 was completely disordered, i.e. there was no trace of definitive GaAs and GaAlAs layers in the superlattice. This a significant advancement in disordering time compared to SIIID as taught in U.S. Pat. No. 4,511,408, which requires, for example, several hours of time to bring about such disordering, e.g. as much as 10 hours to bring about a 1–2 μm disordered depth at a temperature of 850° C. following Si implantation. Rather than either implant and anneal or diffuse, it is more expedient and efficient to grow a GaAs/Si superlattice 124 that, if patterned for example, will provide in situ spatially disordered regions of the underlying superlattice 122 which form wide bandgap regions between which are undisturbed superlattice regions of narrower bandgap material to function as optical laser cavities for stimulated emission under lasing conditions in a multiple emitter heterojunction laser device. This process eliminates the need for any introduction of a disordering element after crystal growth, as specifically taught in U.S. Pat. No. 4,511,408, which process requires a zinc diffusion into an as-grown superlattice or well structure or a silicon implantation followed by annealing in an as-grown superlattice or well structure to produce selectively disordered regions in a superlattice structure.

In another case of growth of a heterostructure 116, superlattice 122 was epitaxially grown at 725° C. followed by growth of a Si–GaAs superlattice 124 of alternating layers of Si and GaAs with the GaAs layers about 60 Å thick and the Si spikes about one monolayer thick. It turns out that superlattice 122 did not disorder during the growth process of superlattice 124. A subsequent thermal annealing treatment at 850° C. of this sample caused the deposited Si in their monolayers to be activated and move around laterally in their monolayers to form Si—Si pairs and thence Si—Si pair clusters or alloy, $(Si_2)_x(GaAs)_{1-x}$. A n-type doping profile taken on by superlattice 124 before annealing was $8 \times 10^{18}$ but dropped to $3-5 \times 10^{17}$ after annealing, supporting atomic planar doping changes and Si—Si pair clustering. However, as previously mentioned, there was no disordering of the underlying superlattice 122. It is believed, although not absolutely certain or conclusive, that the employment of larger GaAs layers in superlattice 124 and the growth of the heterostructure at lower temperatures, such as about 725° C. to 755° C., has an effect as to whether conditions are best for providing in situ induced disordering. The upper superlattice 124 must consist of thin layers and be developed at a temperature consistent with alloying of the IV elemental component being employed. While SI has proved to be a suitable in situ disordering component, there are certain to be other elemental components functioning as suitable substitutes for Si, for example, C, Sn or Ge are likely candidates and possibly shallow or deep level impurities having alloying capabilities. Also, single and multiple quantum well heterostructures may be substituted for superlattice 122.

Figure 12:
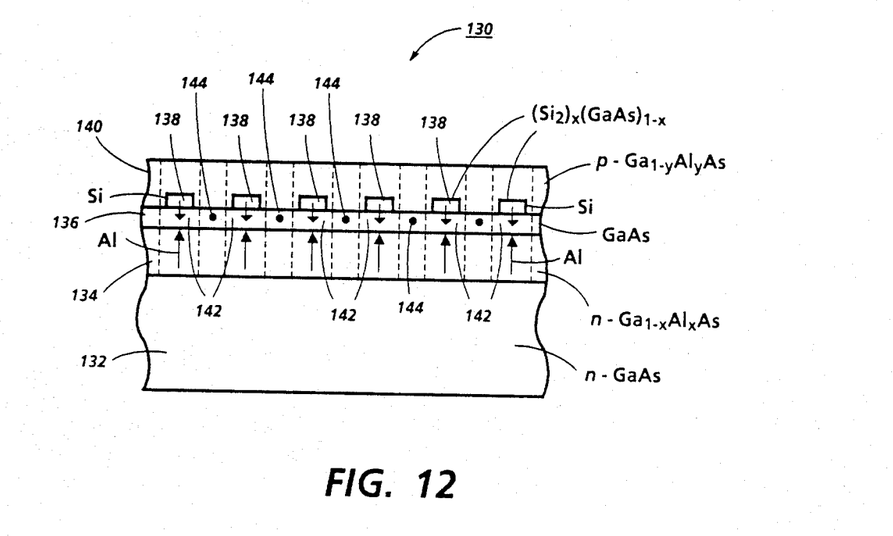
FIG. 12 is a heterostructure having spaced regions of higher bandgap alloy material formed Si and Al interdiffusion from in situ deposited Si or $(Si_2)_x(GaAs)_{1-x}$ functioning as a finite internal Si source, useful in the formation of three dimensional buried active regions for multiple emitter heterostructure lasers.

Heterostructure laser 130 in FIG. 12 comprises a substrate 132 of n-GaAs upon which is epitaxially deposited, via MOCVD, a cladding layer 134 of $n-Ga_{1-x}Al_xAs$ followed by the growth of an active region 136 of GaAs. A mask in the confines of the MOCVD reactor is then positioned on the GaAs surface of heterostructure 130 with spatially separated apertures exposing longitudinal regions of the GaAs surface. Growth is continued with $(CH_3)_3Ga$, $SiH_4$ and $AsH_3$ to form alloy strips 138 of $(Si_2)_x(GaAs)_{1-x}$. Strips 138 may, for example, be 700 Å comprising $(Si_2)_{0.5}(GaAs)_{0.5}$ or, alternatively, a plurality of alternating layers of Si—Si and GaAs with reactor growth temperature at about 825° C. Strips 138 may be several monolayers to several angstroms thick. Upon completion of the growth of strips 138, cladding layer 140 of $p-Ga_{1-y}Al_yAs$ is deposited followed by a p+GaAs cap layer (not shown). During the higher temperature growth of strips 138, Al and Si atoms from respective layers and strips 134 and 138 will diffuse into GaAs regions 142 therebetween, forming regions of wider bandgap material compared to adjacent regions 144. Regions 144, are, in fact, the lowest bandgap material, surrounded on all sides by higher bandgap material comprising layers 134 and 140 and adjacent diffused regions 144. Regions 144 form three dimensional buried active regions providing a plurality of multi-emitting regions in hetrostructure laser 130. The interdiffusion of Si and Al to form wider bandgap regions 142 may be enhanced by subsequent thermal annealing. Thus, strips 138 function as finite internal Si diffusion sources for internal interdiffusion with adjacent regions to change the bandgap of these regions in a desirable configuration. To be noted is that the integrity of active region 136 is not fully disordered in the presence of an internal Si source vis a vis surface initiated impurity induced disordering utilizing Si impurity wherein diffusion of Si would substantially smear out or disorder the active region.

Alternatively, layer 143 in heterostructure 130 may be comprised of multiple layers of Si and GaAs or $(Si_2)_x(GaAs)_{1-x}$ and GaAs.

The above illustrations of heterostructures all relate to the formation of barriers, wells or spikes via the formation of an $(IV)_x(GaAs)_{1-x}$ alloy in situ using MOCVD processing. Heterostructure lasers fabricated to include such heterostructures have shown to improved threshold operation with a $T_o$ of about 260° C. in the case of double quantum well heterostructure lasers and a $T_o$ of about 326° C. in the case of multiple quantum well heterostructure lasers.

Figure 13A:
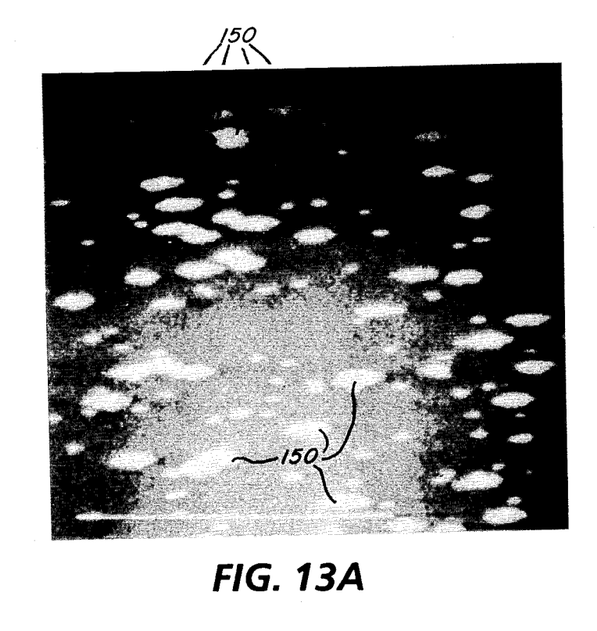
FIGS. 13A and 13B are SEM micrographs of the surface of a sample illustrating $(Si_2)_x(GaAs)_{1-x}$ island formation respectively for unstained and stained conditions, the latter condition being provided for emphasis.

In connection with studies conducted relative to these heterostructures, a further phenomenon has been observed relative to the Si—Si pairs forming in clusters on a III-V surface, e.g. a GaAs or a GaAlAs surface, for example. This cluster formation is visible in the SEM micrograms of FIG. 13 at 150. The clustering effect occurs during pyrolytic deposition creating a multitude of island formations 150, as shown in both FIGS. 13A and 13B, of the alloy, $(Si_2)_x(GaAs)_{1-x}$. These islands 150 in FIG. 13A are shown in their natural state, while in FIG. 13B, the islands 150 have been stained to heighten and contrast them against the surface background. Islands 150 pyrolytically deposited as a $(IV)_x(III-V)_{1-x}$ alloy relative to an active region comprising either GaAs or GaAlAs within the confines of a heterostructure may function as three dimensional barriers or wells. In the case of the alloy, $(Ge_2)_x(GaAs)_{1-x}$, these islands would represent narrower bandgap material in the active region functioning as a multitude of three dimensional quantum wells in the active region. In the case of the alloy, $(Si_2)_x(GaAs)_{1-x}$, when x is approximately equal to or less than 0.05 these islands would represent wider bandgap material in the active region functioning as a multitude of three dimensional quantum barriers in the active region.

Figure 13B:
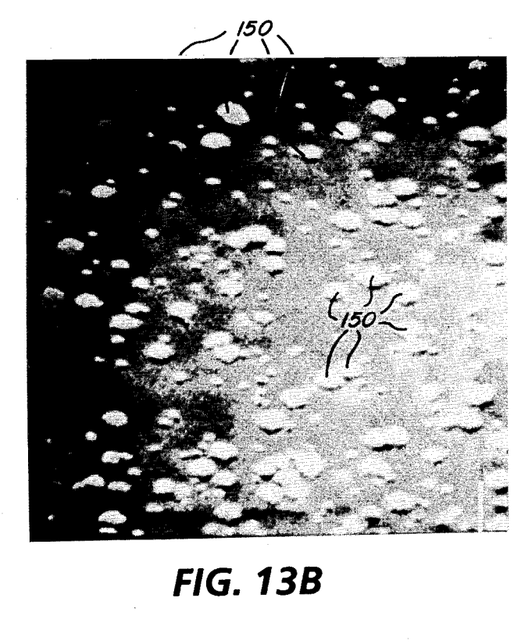

It is not known precisely how these islands are formed in the MOCVD process and, therefore, this phenomenon has not been completely clarified physically or theoretically. However, while not desiring to be bound to the following theory, it is believed that relative to the present invention, the Si—Si pairs formed in the gas phase under proper temperature conditions have the initial ability or freedom to move along the surface of the sample but will readily anchor to and cluster on one or more Al atoms exposed on the surface of the sample in reaction zone of the MOCVD reactor and become stationary forming alloy islands containing a very small amount of Al. The Al atom or atoms act as a catalyst for island formation and the free moving Si—Si pairs will anchor or attach to the Al atoms preventing their further movement. The reaction zone temperature in forming islands 150 is important and is preferably in the range of 820° C.-825° C. in the case of Si.

The Al atoms exposed on the sample surface function as nucleation or catalytic sites for Si—Si pairs, Ge—Ge pairs and Si-Ge pairs which attach and build up on the sites to form the resultant islands 150. Once a IV—IV pair has attached to an Al site, the process has begun and IV—IV pairs continue to be attached and attach themselves to the sites. For example, there may be one Al atom at a site to which $10^{10}$ silicon atoms may attach over time. Ti and Mg atoms on a III-V surface also will function in the same manner as Al as a surface fixer or cluster collector. It is also thought that the use of Al as a fixer to form alloy islands in addition helps to purge the reactor system in combination with the arsine flow and prevent or reduce any detrimental effects of contamination due to large amounts of Si being introduced into the reactor.

A uniform distribution of sites on a III-V surface may be obtained initially by alternating flow of $(CH_3)_3Ga, (CH_3)_3Al$ and $AsH_3$ with $SiH_4$, forming, for example, $Ga_{0.7}Al_{0.3}As$ and $Si_2$, and then subsequently shutting off the flow of $(CH_3)_3Al$ to permit the initiation of the IV—IV nucleation process, that is, an alternating the gas flow $(CH_3)_3Ga$ and $AsH_3$ with $SiH_4$ and $AsH_3$ to form alloy islands of $(Si_2)_x(GaAs)_{1-x}$.

It is to be noted that alloy islands 150 of $(Si_2)_x(GaAs)_{1-x}$ with some minor inclusion of Al have a wider bandgap than GaAlAs and, therefore, form a higher carrier barrier that permits carrier passage in a field of three dimensional barriers amid the active region of a heterostructure.

In summary, then, alloy formation on a III-V surface is possible at proper temperatures with IV—IV pairs being controlled relative to specific nucleation sites by a cluster collector element, e.g. Al, Mg and Ti, wherein only a tiny bit of such an element is needed on the depositing surface to function as a dopant or nucleating source or catalyst but does not represent a major component in the finally pyrolytically deposited structure.

Figure 14:
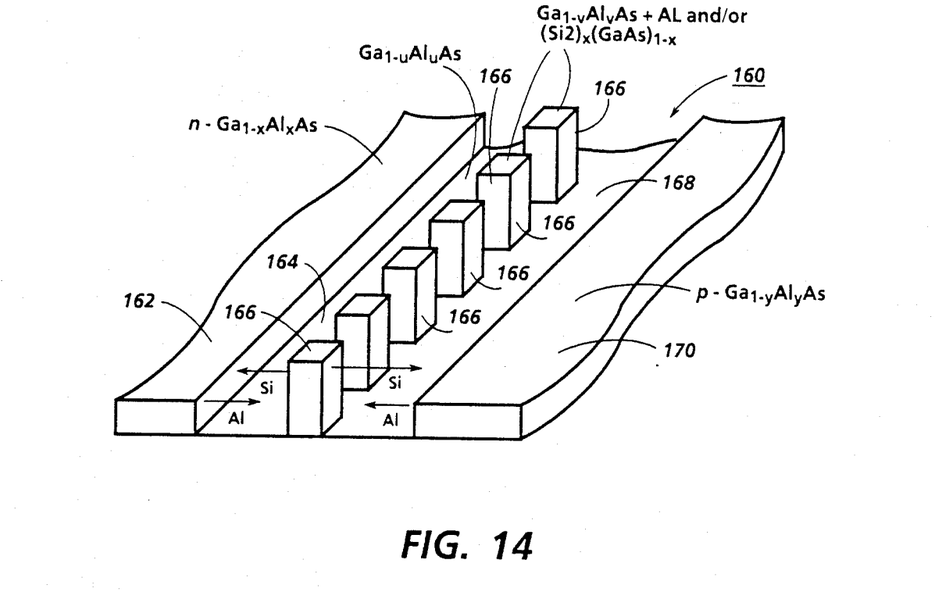
FIG. 14 is a perspective view of a partial three dimensional energy band profile for a heterostructure having a region of wide bandgap alloy islands in the active region of the heterostructure.

FIG. 14 is a partial three dimensional energy band profile of a heterostructure 160 depicting three dimensional barriers in the form of islands 166 of alloy, $(Si_2)_x(GaAs)_{1-x}$. Heterostructure 160 comprises epitaxially deposited confinement layer 162 of n-$Ga_{1-x}Al_xAs$ followed by a GaAs or $Ga_{1-u}Al_uAs$ layer 164 wherein $x > u$. The growth of layer 164 is subsequently interrupted by the alternating growth of Si and $Ga_{1-v}Al_vAs$ and then Si and GaAs, in the manner as previously explained above, forming islands 166 of the alloy, $(Si_2)_x(GaAs)_{1-x}$ with island attachment to surface Al atoms or exposed Al atoms in $Ga_{1-v}Al_vAs$ or both. Islands 166 form a wider bandgap material compared to confinement layer 162 as depicted by their relative heights in FIG. 14.

Epitaxial growth is continued with the deposition of GaAs or $Ga_{1-u}Al_uAs$ layer 168 followed by the growth of confinement layer 170 of p-$Ga_{1-y}Al_yAs$ where $x \simeq y > u > v$. Islands 166 are illustrated in uniform alignment for purposes of illustration and would, of course, not occur in this manner but rather form in a fairly random pattern. The use of heterostructure 160 in a heterostructure laser device would result in a low threshold device with desired high $T_o$ operation.

During the growth of the active region of heterostructure 160 comprising layers 164 and 168 and islands 166, the interdiffusion of Al and Si would also occur. Such interdiffusion could be enhanced by subsequent internal impurity diffusion in design of an active region with prescribed bandgap properties. To be noted is that there would be no complete disordering of this active region via the internally deposited Si sources, even with subsequent thermal diffusion to promote Al and Si interdiffusion, as in the case surface initiated Si impurity induced disordering. In the case of Si, the internal impurity diffusion temperature may be about 850° C. Alternatively, islands 166 may be three dimensional wells comprising $(Ge_2)_x(GaAs)_{1-x}$ with very small amounts of Al.

While aspects of this invention have been illustrated relative to the alloys, $(Si_2)_x(GaAs)_{1-x}$ and $(Ge_2)_x(GaAs)_{1-x}$, the forgoing embodiments can also include as alternatives the alloys of C and Sn in the region of their solubility limit in GaAs, i.e. $(C_2)_x(GaAs)_{1-x}$ and $(Sn_2)_x(GaAs)_{1-x}$.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a heterostructure comprising at least one epitaxially deposited compound comprising a III–V constituent, the epitaxial deposition in situ of a $(IV)_x(III-V)_{1-x}$ alloy comprising a group IV elemental constituent and group III–V constituent forming a majority carrier barrier or well in said heterostructure.

2. The heterostructure of claim 1 wherein the IV elemental constituent comprises Si, C, Ge or Sn and the III–V constituent comprises GaAs, AlAs, GaAlAs, GaAlAsP, InGaAlP, InAlAsP or InGaAlAsP.

3. The heterostructure of claim 1 wherein the IV elemental constituent comprises Si and the group III–V constituent comprises GaAs, the deposited alloy comprising a majority carrier barrier in said heterostructure.

4. The heterostructure of claim 1 wherein the IV elemental constituent comprises Ge and the III–V constituent comprises GaAs, the deposited alloy comprising a majority carrier well in said heterostructure.

5. The heterostructure of claim 1 wherein nucleating means is introduced prior to or concurrently with said in situ epitaxial deposition of said alloy, said group IV elemental constituent anchoring to said nucleating means forming a plurality of discrete islands constituting majority carrier barriers or wells in said heterostructure.

6. The semiconductor device of claim 5 comprising a semiconductor heterojunction laser.

7. The heterostructure of claim 5 wherein said nucleating means comprises Al, Mg or Ti.

8. The heterostructure of claim 1 formed as the active region of a heterojunction semiconductor laser.

9. In a semiconductor device, a disordered alloy region created in situ during structural growth of said device, said region produced from a first III–V semiconductor constituent forming an active region interposed between second III–V semiconductor constituents forming barrier layers via in situ growth thereon of a semiconductor structure including a disordering component whereby said region is produced by completion of growth of said structure.

10. The semiconductor device of claim 9 wherein said disordering component comprises a group IV element.

11. The semiconductor device of claim 9 wherein said disordering component comprises Si.

12. The semiconductor device of claim 9 wherein said semiconductor structure comprises a superlattice of alternating layers of said disordering component and said first III–V semiconductor constituent.

13. The semiconductor device of claim 9 wherein said first and second III–V semiconductor constituents comprise a superlattice thereof.

14. The semiconductor device of claim 5 wherein said first III–V semiconductor constituent exhibits quantum size effects.

15. The semiconductor device of claim 9 wherein said structure comprises alternating layers of said disordering component and a third III–V semiconductor constituent.

16. The semiconductor device of claim 15 wherein said first and third III–V semiconductor constituents are GaAs, said second III–V semiconductor constituent is $Ga_{1-x}Al_xAs$ and said disordering component comprises spatially separated monolayers of Si.

* * * * *